(12) United States Patent
Casey et al.

(10) Patent No.: US 6,475,555 B2
(45) Date of Patent: *Nov. 5, 2002

(54) PROCESS FOR SCREENING FEATURES ON AN ELECTRONIC SUBSTRATE WITH A LOW VISCOSITY PASTE

(75) Inventors: Jon A. Casey, Poughkeepsie; Dinesh Gupta, Hopewell Junction; Lester Wynn Herron, New Paltz; John U. Knickerbocker, Hopewell Junction; David C. Long, Wappingers Falls; Jawahar P. Nayak, Wappingers Falls; Brenda L. Peterson, Wappingers Falls; Robert A. Rita, Wappingers Falls, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/429,256

(22) Filed: Oct. 29, 1999

(65) Prior Publication Data

US 2002/0009539 A1 Jan. 24, 2002

(51) Int. Cl.⁷ .............................. B05D 1/32; B05D 5/12
(52) U.S. Cl. .................. 427/96; 427/123; 427/282; 427/287; 427/301; 427/302; 427/355
(58) Field of Search .................. 427/282, 287, 427/355, 123, 125, 96, 301, 302

(56) References Cited

U.S. PATENT DOCUMENTS

| | | | | |
|---|---|---|---|---|
| 4,670,351 A | * | 6/1987 | Keane et al. | 427/96 |
| 4,960,614 A | * | 10/1990 | Durand | 427/96 |
| 5,249,520 A | * | 10/1993 | Andris et al. | 101/126 |
| 5,376,403 A | | 12/1994 | Capote et al. | 427/96 |
| 5,393,568 A | * | 2/1995 | Valente et al. | 427/123 |
| 5,492,266 A | | 2/1996 | Hoebener et al. | 228/248.1 |
| 5,543,585 A | | 8/1996 | Booth et al. | 174/261 |
| 5,733,603 A | * | 3/1998 | Turkevich et al. | 427/340 |
| 5,830,307 A | * | 11/1998 | Hiruta et al. | 427/282 |
| 5,918,796 A | * | 7/1999 | Matsuda et al. | 427/123 |
| 6,027,762 A | * | 2/2000 | Tomita et al. | 427/96 |
| 6,120,708 A | * | 9/2000 | Ohshita et al. | 252/511 |
| 6,180,226 B1 | * | 1/2001 | McArdle et al. | 427/96 |

* cited by examiner

Primary Examiner—Shrive P. Beck
Assistant Examiner—Kirsten A. Crockford
(74) Attorney, Agent, or Firm—Ira D. Blecker

(57) ABSTRACT

A process wherein a low viscosity, metal-containing paste is screened onto a ceramic greensheet and then sets up to increase its viscosity. In one method, the low viscosity is caused by excess solvent which is then blotted or otherwise removed so that the viscosity of the paste is increased. In an alternative method, the low viscosity paste contains a cross-linking agent which causes the paste to increase its viscosity after screening.

6 Claims, 1 Drawing Sheet

PROCESS FOR SCREENING FEATURES ON AN ELECTRONIC SUBSTRATE WITH A LOW VISCOSITY PASTE

BACKGROUND OF THE INVENTION

The present invention relates to a process for screening features, such as wiring lines and vias on an electronic substrate and, more particularly, relates to a process for screening such features using a low viscosity paste.

Multilayer ceramic (MLC) structures are used in the production of electronic substrates and devices. The MLCs can have various layering configurations. For example, an MLC circuit substrate may comprise patterned metal layers which act as electrical conductors sandwiched between ceramic layers which act as a dielectric medium. For the purposes of interlayer interconnections, most of the ceramic layers have via holes, more typically called vias. Prior to lamination, the vias are typically filled with an electrically conductive paste, such as a metallic paste, and sintered to form vias which provide the electrical connection between the layers. In addition, the MLC substrates may have termination pads for attaching semiconductor chips, connector leads, capacitors, resistors, to name a few.

Generally, conventional ceramic structures are formed from ceramic greensheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible greensheets. After via formation, metal paste screening, stacking and laminating, the greensheets are fired or sintered at temperatures sufficient to burn-off or remove the unwanted polymeric binder resin and sinter the ceramic particulate together into a densified ceramic substrate. The present invention is directed to the metal paste screening step of this process.

The patterning of ceramic greensheets used for the production of MLC substrates typically involves the silk screening or extrusion screening of a metal-filled organic paste. In order to achieve the necessary dimensional control of the metal circuitry features, such as wiring lines and vias, the rheology of the metal paste must be carefully controlled such that the paste does not bleed out once applied to the ceramic greensheet. To achieve this type of behavior, the metal pastes typically have a relatively high viscosity which is not conducive to filling the vias. For via filling, the rheological requirements for the paste are typically quite different compared to the paste requirements for the wiring line patterns. For this reason, most MLC processes involve two step screening where the wiring line pattern is formed in one process and the vias are filled in another process step.

Hoebener et al. U.S. Pat. No. 5,492,266, the disclosure of which is incorporated by reference herein, recognizes the difficulty of screening solder in fine pitch patterns due to, among other things, solder paste viscosity and rheology. Hoebener et al. resolve their problem by screening solder paste through a stencil and then reflowing the solder before the stencil is removed.

Booth et al. U.S. Pat. No. 5,543,585, the disclosure of which is incorporated by reference herein, discloses the screening of a conductive adhesive emulsion (consisting of conductive adhesive and a solvent) into holes for electrically connecting a chip and a substrate. After application of the conductive adhesive, the conductive adhesive is heated to drive off the solvent.

Capote et al. U.S. Pat. No. 5,376,403, the disclosure of which is incorporated by reference herein, discloses an electrically conductive composition which may include a metal powder, a solder powder (in addition to the metal powder), a cross-linking agent, a resin and a reactive monomer. The electrically conductive composition may be applied as a wiring pattern by screening. After application, the electrically conductive composition is heated to cure it. The electrically conductive composition may be used on any substrate that can withstand the curing temperature.

Ideally, one metal-filled paste would be available which can be used for both via filling and wiring line patterning of the ceramic greensheet. To achieve this objective, the paste must have a low enough viscosity to fill the small vias yet be able to produce fine wiring lines and patterns of the wiring circuitry on the surface of the ceramic greensheet. Further, the paste must "set up", i.e., increase its viscosity, without excessive bleeding into the ceramic greensheet and cannot, due to the nature of the ceramic greensheet, be cured by heating.

Accordingly, it is a purpose of the present invention to have a metal-filled paste which is suitable for producing via filling and wiring line patterning of ceramic greensheets.

It is another purpose of the present invention to have a metal-filled paste which has a low enough viscosity to fill the vias and form wiring lines and patterns.

It is yet another purpose of the present invention for the metal-filled paste to set up after application of the metal-filled paste to the ceramic greensheet.

These and other purposes of the present invention will become more apparent after referring to the following description considered in conjunction with the accompanying drawings.

BRIEF SUMMARY OF THE INVENTION

A first aspect of the present invention relates to a process for screening features on an electronic substrate, the process comprising the steps of:
  obtaining a low viscosity paste comprising at least a metallic material, solvent and binder, said low viscosity paste having an excess of solvent over what is needed to dissolve the binder;
  screening the low viscosity paste onto an electronic substrate to form at least one feature;
  blotting the excess solvent with a blotting material so as to increase the viscosity of the low viscosity paste; and
  removing the blotting material.

A second aspect of the invention relates to a process for screening features on an electronic substrate, the process comprising the steps of:
  obtaining a low viscosity paste comprising at least a metallic material and one of the following: solvent/binder/reactive monomer/cross-linking agent or resin/cross-linking agent; and
  screening the low viscosity paste onto an electronic substrate to form at least one feature wherein the reactive monomer/cross-linking agent or resin/cross-linking agent cause an increase in the viscosity of the low viscosity paste.

A third aspect of the present invention relates to a process for screening features on an electronic substrate, the process comprising the steps of:
  obtaining a low viscosity paste comprising at least a metallic material, a solvent, a binder, a reactive monomer, and a cross-linking agent; and screening the low viscosity paste onto an electronic substrate to from at least one feature wherein the reactive monomer and cross-linking agent cause an increase in the viscosity of the low viscosity paste.

A fourth aspect of the present invention relates to a process for screening features on an electronic substrate, the process comprising the steps of:

obtaining a low viscosity paste comprising at least a metallic material, a resin and a cross-linking agent; and screening the low viscosity paste onto an electronic substrate to from at least one feature wherein the resin and cross-linking agent cause an increase in the viscosity of the low viscosity paste.

A fifth aspect of the present invention relates to a process for screening features on an electronic substrate, the process comprising the steps of:

obtaining a low viscosity paste comprising at least a metallic material and one of the following: solvent/binder/reactive monomer or resin;

applying a cross-linking agent to a surface of an electronic substrate; and screening the low viscosity paste onto an electronic substrate and the cross-linking agent to form at least one feature wherein the reactive monomer/cross-linking agent or resin/cross-linking agent cause an increase in the viscosity of the low viscosity paste.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
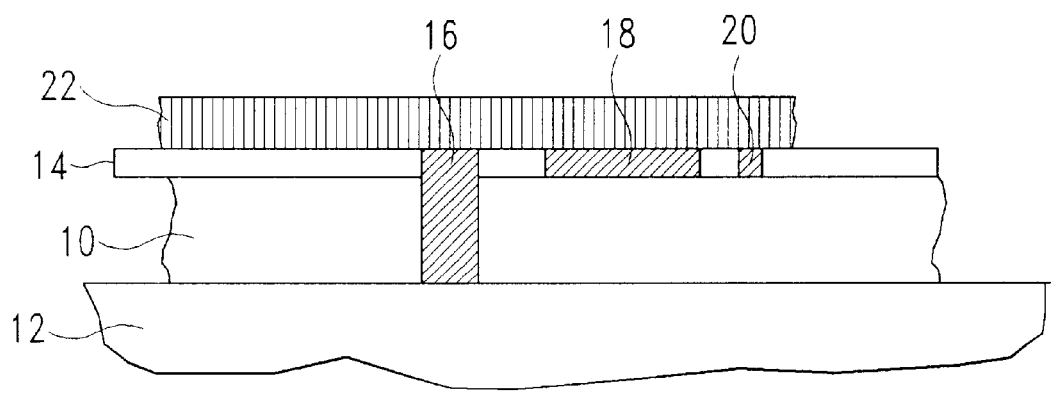
FIG. 1 is a cross sectional view of a ceramic greensheet being blotted.

According to the present invention, a low viscosity paste is screened on a ceramic greensheet to form wiring lines and to fill the vias. The low viscosity paste may be silk screened or extrusion screened.

By a first method of the present invention, a low viscosity paste is formed which has an excess of solvent. The excess of solvent is removed before it can bleed into the ceramic greensheet. By a second method of the present invention, a low viscosity paste is formed which has a cross-linking agent that causes the paste to set up shortly after the paste is applied.

According to the first method of the present invention, a low viscosity paste is formed. Typically, organic metal-filled pastes contain a solvent, binder material, one or more metals and optionally ceramic or glass material for aiding the adhesion of the sintered metal feature to the abutting ceramic. The paste may also contain so-called Theological modifiers that change the rheological properties of the paste. The solvent and binder material are matched for chemical compatibility. For example, for hydrocarbon based pastes the solvent may be ink oil and the binder PICCOVAR hydrocarbon resin (available from Hercules Inc.). Alternatively, the solvent may be more polar such as terpineol or Texanol (commercially available from Eastman Chemical) and the binder polyvinyl alcohol or ethyl cellulose. The metals used in ceramic greensheets are typically molybdenum, tungsten, copper, nickel, silver and palladium. The paste may also contain fillers such as frit (glass particles) or grit (ceramic particles).

For a typical paste, it is expected that the proportions of solvent and binder are about 12 weight % and 1.5 weight %, respectively. Usually in the prior art, just enough solvent is added to the paste composition to put the binder into solution. Any excess solvent had been considered to be undesirable as it would bleed into the ceramic greensheet and adversely affect the properties of the ceramic greensheet such as dimensional stability and/or pattern distortion. The exact ratio of solvent to binder is established by the screening performance of the paste along with the fundamental properties of the materials used to fabricate the paste. This is due to the fact that the paste rheology (viscosity) is strongly affected by variables such as solids loading, binder molecular weight, solids particle size, amount of rheology modifiers added to the paste, and many other variables. For each paste system, a suitable binder:solvent ratio is established based primarily on its screening performance. The metal and glass or ceramic additions would be added in the desired proportions as dictated by the circumstances.

Such a metal-filled paste is highly viscous and can be screened only with great difficulty. The present inventors, however, are proposing to add an excess of solvent, for example, 0.5 to 5 weight % extra solvent to reduce the viscosity of the paste. The lower viscosity paste would then be screened onto the ceramic greensheet. However, due to the excess solvent, some of the solvent would bleed into the ceramic greensheet. Such paste bleed is an undesirable condition as it adversely affects the properties of the ceramic greensheet as noted above. After screening, according to the present invention, the excess solvent is blotted to prevent paste bleed.

Referring now to FIG. 1, ceramic greensheet 10 sitting on support plate 12 has been extrusion screened through mask 14 with a low viscosity paste according to the present invention. The low viscosity paste has been used to form via 16, X-wiring line 18 and Y-wiring line 20. Before removal of the mask 14, blotter 22 is applied to absorb any excess solvent. Thus, a low viscosity paste is used to screen via 16 and wiring lines 18, 20 which, after blotting, sets up into a high viscosity paste. The ceramic greensheet is now ready for further processing as is conventional.

Figure 2:
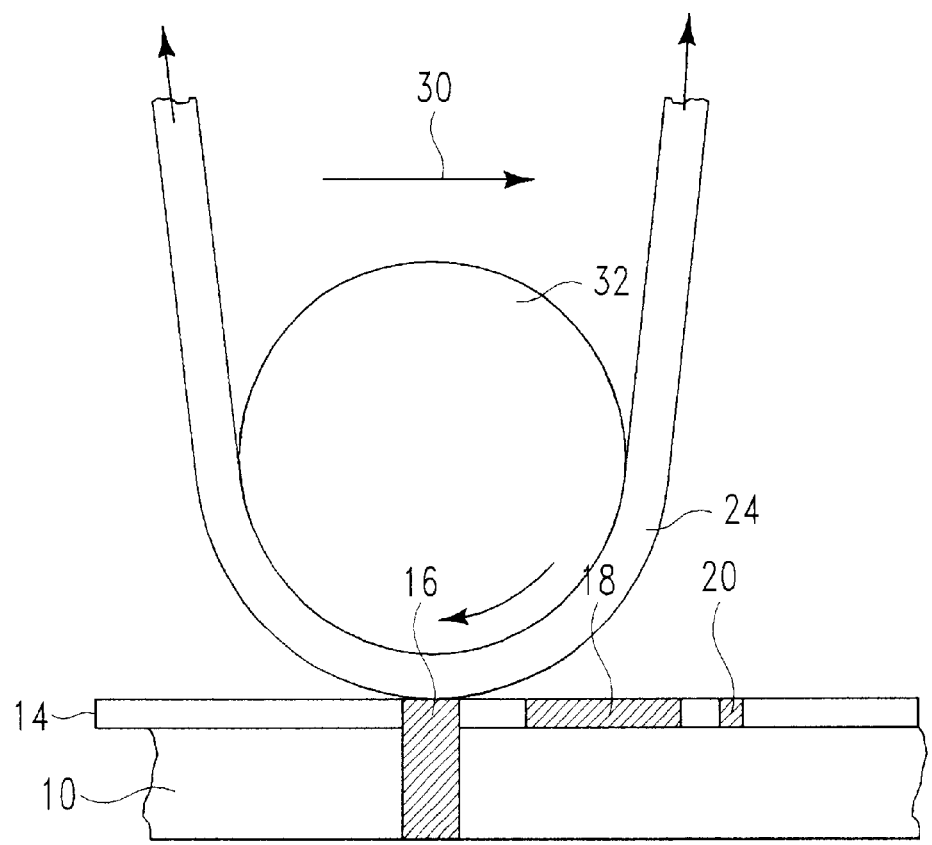
FIG. 2 is a cross section view of a ceramic greensheet being blotted by a rolling blotter.

The blotting of the low viscosity paste can be automated by an apparatus as shown in FIG. 2. In this apparatus, blotter 24 on roller 32 is caused to move over the surface of the mask 14 (after screening of the low viscosity paste) in the direction of arrow 30 to blot up the excess solvent in the low viscosity paste. Blotter 24 is a long sheet of blotter material supplied from a supply spool (not shown) and taken up by a waste takeup spool (not shown).

The blotting material 22, 24 for the present invention may be any suitable material that extracts the solvent from the low viscosity paste without strongly adhering to the paste since the paste must not be damaged during the removal of the blotting material. Some suitable materials for the blotting material are paper, plastic coated paper and porous polymer membranes made from polyethylene, ultra high density polyethylene (e.g., SOLUPOR, available from DSM Kunststoffen B. V.), and fluoropolymers (e.g., TEFLON, available from E. I. duPont de Nemours and Company). The previously listed materials may also include wetting agents to improve the absorption of the materials.

According to the second method of the present invention, a low viscosity paste is formulated to include a reactive component which when mixed together with either a curing agent or exposed to moisture, undergoes a rapid polymerization, resulting in a rapid viscosity increase. Reactive components which require extensive heat cure are not acceptable as the heat cure could degrade the properties of the ceramic greensheet. An example of the first case would be cyanoacrylate monomers (such as ethy cyanoacrylate) and initiators added to a conventional metal-filled organic paste. The reactive component (cyanoacrylate monomer plus initiator) would initially cause a decrease in viscosity of the paste but upon exposure to the moisture in the atmosphere, would set up, causing the viscosity of the paste to quickly increase. The amount of monomer and initiator added to the metal-filled organic paste should be in the amount of 5 to 35 weight % with the optimum amount being determined by experimentation. In addition to cyanoacrylate monomers, other components could include wetting agents and accelerants.

In the second case of this method, the solvent and binder can be replaced by two component adhesive systems such as two component rapid cure epoxies (mercapto chemistries). The epoxy systems can undergo very rapid curing and thus require a mixing of the components (resin and curing agents) immediately prior to the paste screening operation. The mixing of the two adhesive components just prior to screening can easily be accomplished by using a static mixing nozzle fitted to the screening nozzle so that the two components are mixed just prior to screening. A paste containing the two component adhesive systems should contain about 5 to 35 weight % adhesive (resin plus hardener). The remainder of the paste would comprise metallic particles and optional glass and/or ceramic particles. In addition to the epoxies, other two component systems could include acrylates and urethanes.

A third case of this method involves applying (for example, by spraying) an activator or accelerant directly to the greensheet surface. After application, a paste which contains active components is applied to the greensheet. The reactive components in the paste react with the activator/accelerant on the surface of the greensheet, resulting in a rapid crosslinking of the active paste components (e.g., cyanoacrylate monomers) at the paste/greensheet interface. This rapid curing can result in improved dimensional control of the screened features.

The purposes and advantages of the present invention will be more apparent after referring to the following examples.

EXAMPLES

Example I

Formulate a paste containing 81 weight % molybdenum powder, 15.275 weight % terpineol (solvent), 1.725 weight % ethyl cellulose resin (binder), and 2 weight % thixcin rheological modifier. In this paste, there is an excess of solvent of about 2 weight %. Then, screen the paste onto an alumina-based ceramic greensheet. After screening the pattern, apply a planar blotter made of porous ultra high density polyethylene to the top of the sheet to extract excess solvent from the paste.

Example II

Formulate a paste using a two component (i.e., resin component and hardener component) rapid cure epoxy system. The rapid cure epoxy system to be used is a 1:1 system such that equal parts of resin and hardener components are mixed together. Then, disperse molybdenum powder into each individual component (resin component and hardener component) at a loading of about 70 weight %. The primary component of the resin is a bisphenol A diglycidyl ether polymer. The hardener contains a mixed cross linking agent consisting of a dimethylene triamine and an aliphatic mercaptan epoxy resin polymer.

To facilitate the incorporation and dispersion of the molybdenum powder into the epoxy components, add a small amount of HYPERMER surfactant (available from Imperial Chemical Industries PLC) to each of the epoxy components. Use a conventional 3-roll high shear mill to mechanically disperse the molybdenum powder within each of the epoxy components. After introduction of the molybdenum into the epoxy, mix the resin and hardener epoxy components with a static mixing nozzle and then extrusion screen the mixed epoxy onto an alumina-based ceramic greensheet. Cross-linking of the components will occur in 5 to 20 minutes.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A process for screening features on an electronic substrate, the process comprising the steps of:

obtaining a paste comprising at least a metallic material and one of the following combinations of materials: a solvent, a binder, a reactive monomer and a cross-linking agent or a resin and a cross-linking agent; and screening the paste onto an electronic substrate to form at least one electrically conducting feature wherein the reactive monomer and cross-linking agent or resin and cross-linking agent react in-situ to cause curing and an increase in the viscosity of the paste, the curing of the paste being due solely to the in-situ reaction of the reactive monomer and cross-linking agent or resin and cross-linking agent, wherein the electronic substrate is a greensheet.

2. A process for screening features on an electronic substrate, the process comprising the steps of:

obtaining a paste comprising at least a metallic material, a solvent, a binder, a reactive monomer, and a cross-linking agent; and screening the paste onto an electronic substrate to form at least one electrically conducting feature wherein the reactive monomer and cross-linking agent react in-situ to cause curing and an increase in the viscosity of the paste, the curing of the paste being due solely to the in-situ reaction of the reactive monomer and cross-linking agent, wherein the electronic substrate is a greensheet.

3. The process of claim 2 wherein the reactive monomer and cross-linking agent in combination comprise 5 to 35 weight percent of the paste.

4. A process for screening features on an electronic substrate, the process comprising the steps of:

obtaining a paste comprising at least a metallic material, a resin and a cross-linking agent; and screening the paste onto an electronic substrate to form at least one electrically conducting feature wherein the resin and cross-linking agent react in-situ to cause curing and an increase in the viscosity of the paste, the curing of the paste being due solely to the in-situ reaction of the resin and cross-linking agent, wherein the electronic substrate is a greensheet.

5. The process of claim 4 wherein the resin and cross-linking agent in combination comprise 5 to 35 weight percent of the paste.

6. A process for screening features on an electronic substrate, the process comprising the steps of:

obtaining a paste comprising at least a metallic material and one of the following: (i) a solvent, a binder, and a reactive monomer, or (ii) a resin;

applying a cross-linking agent to a surface of an electronic substrate; and screening the paste onto an electronic substrate and the cross-linking agent to form at least one electrically conducting feature wherein the reactive monomer and cross-linking agent or resin and cross-linking agent react in-situ to cause curing and an increase in the viscosity of the paste, the curing of the paste being due solely to the in-situ reaction of the reactive monomer and cross-linking agent or resin and cross-linking agent, wherein the electronic substrate is a greensheet.

* * * * *